(12) United States Patent
Wang

(10) Patent No.: US 9,177,798 B1
(45) Date of Patent: Nov. 3, 2015

(54) METHOD FOR YIELD IMPROVEMENT OF TMBS DEVICES

(71) Applicant: Advanced Semiconductor Manufacturing Corporation Limited, Shanghai (CN)

(72) Inventor: Xizheng Wang, Shanghai (CN)

(73) Assignee: Advanced Semiconductor Manufacturing Corporation Limited, Shanghai (CN)

(*) Notice: Subject to any disclaimer, the term of this patent is extended or adjusted under 35 U.S.C. 154(b) by 0 days.

(21) Appl. No.: 14/573,708

(22) Filed: Dec. 17, 2014

(30) Foreign Application Priority Data

May 12, 2014 (CN) .......................... 2014 1 0198290

(51) Int. Cl.
| | |
|---|---|
| *H01L 21/8234* | (2006.01) |
| *H01L 21/04* | (2006.01) |
| *H01L 27/06* | (2006.01) |
| *H01L 27/095* | (2006.01) |

(52) U.S. Cl.
CPC ........ *H01L 21/0495* (2013.01); *H01L 21/8234* (2013.01); *H01L 27/0629* (2013.01); *H01L 27/095* (2013.01)

(58) Field of Classification Search
CPC ............ H01L 21/0495; H01L 21/8234; H01L 27/0629; H01L 27/095
USPC ........... 438/237, 259, 167; 257/288, 471, 211
See application file for complete search history.

(56) References Cited

U.S. PATENT DOCUMENTS

| | | | | |
|---|---|---|---|---|
| 5,726,463 | A | * | 3/1998 | Brown et al. .................... 257/77 |
| 9,076,885 | B2 | * | 7/2015 | Yoshimochi .......................... 1/1 |

* cited by examiner

*Primary Examiner* — Tu-Tu Ho
(74) *Attorney, Agent, or Firm* — Muncy, Geissler, Olds & Lowe, P.C.

(57) ABSTRACT

A method for yield improvement of trench MOS barrier Schottky (TMBS) devices includes: forming a plurality of trenches in a substrate; forming a gate dielectric layer over a surface of the substrate and inner surfaces of the trenches; forming gates in the trenches; forming a first barrier dielectric layer, a second barrier dielectric layer and an intermediate dielectric layer over the trenches; etching the intermediate dielectric layer with the second barrier dielectric layer serving as an etch stop layer to form a window for forming contact holes; etching a portion of the second barrier dielectric layer within the window using the first barrier dielectric layer as an etch stop layer; and etching in the window to remove a portion of the first barrier dielectric layer overlying the gates and a portion of the gate dielectric layer overlying the substrate.

16 Claims, 7 Drawing Sheets

METHOD FOR YIELD IMPROVEMENT OF TMBS DEVICES

CROSS-REFERENCES TO RELATED APPLICATIONS

This application claims the priority of Chinese patent application number 201410198290.5, filed on May 12, 2014, the entire contents of which are incorporated herein by reference.

TECHNICAL FIELD

The present invention relates generally to the fabrication of semiconductor devices, and more particularly to a method of yield improvement of trench MOS barrier Schottky (TMBS) devices.

BACKGROUND

Trench MOS barrier Schottky (TMBS) diodes, also known as metal-semiconductor diodes, are semiconductor devices that debuted in recent years. The TMBS devices feature a low power consumption, large current and ultra high speed. In a TMBS device, a metal is formed in contact with a semiconductor material so as to form a potential barrier (usually called surface barrier or Schottky barrier) at the interface of the metal and the semiconductor material. This potential barrier enables the TMBS device to function as a rectifier or detector. As minority charge carriers in Schottky diodes have a minimal charge storage effect, the frequency response of such devices is limited merely by their RC time constant. Thus, Schottky diodes are ideal devices for high frequency and high switching speed applications.

FIGS. 1 to 5 are schematic cross sections illustrating steps for forming a gate dielectric layer and gates in a conventional process for fabricating a TMBS device, the steps including:

S1) providing a semiconductor substrate 10 which may be implemented as a silicon substrate;

S2) forming a hard mask layer 20 over the semiconductor substrate 10;

S3) successively etching the hard mask layer 20 and the semiconductor substrate 10 to form a plurality of trenches 11 in the semiconductor substrate 10, as shown in FIG. 1;

S4) forming a gate dielectric layer 30 over sidewalls of the plurality of trenches 11, wherein forming the gate dielectric layer 30 may further include the steps of: forming a sacrificial oxide layer (not shown) over the sidewalls of the trenches 11; removing the sacrificial oxide layer by hydrofluoric acid (HF) dip; and forming the gate dielectric layer 30, as shown in FIG. 2;

S5) forming a gate layer (not shown) in the trenches 11 and over the gate dielectric layer 30 and over the hard mask layer 20 and etching the gate layer to form gates 40, such that the hard mask layer 20 is exposed and the gates 40 are substantially flush with the gate dielectric layer 30 at the top, as shown in FIG. 3;

S6) forming an intermediate dielectric layer 50 over the hard mask layer 20, the gate dielectric layer 30 and the gates 40 and densifying the intermediate dielectric layer 50, as shown in FIG. 4; and S7) successively etching the intermediate dielectric layer 50 and the hard mask layer 20 to form a window for subsequently forming holes and contacts, wherein the gates 40 and a portion of the semiconductor substrate 10 are exposed in the window, as shown in FIG. 5, in order to facilitate the subsequent formation of the holes and contacts.

In step S7, the intermediate dielectric layer 50 and the hard mask layer 20 are etched by dry etching, i.e., using plasma of an etchant gas. However, conventional plasma etching process takes 180 s when used to etch a surface dielectric layer with a thickness of 10000 Å. As the plasma is distributed not uniformly in a reaction chamber of the used etching apparatus, i.e., having a higher concentration in a central region than in a peripheral region, the dielectric layer is accordingly etched away at a higher speed in a corresponding central area than in a corresponding peripheral area. This results in a thickness difference of about 200 Å every minute between the two areas of the dielectric layer. At such a pace, the 180 seconds' etching will totally introduce a thickness non-uniformity of at least 600 Å to the dielectric layer.

Further, the intermediate dielectric layer 50 is required to be formed to a large thickness that is generally up to 10000 Å. However, due to equipment constraints, for such a large thickness, the intermediate dielectric layer 50 will originally have a certain thickness non-uniformity itself, 800 Å for each 10000 Å, introduced from its formation process. Therefore, after the dry etching process in step S7, the intermediate dielectric layer 50 will have a total thickness non-uniformity of about 1400 Å. This means after the intermediate dielectric layer 50 and the hard mask layer 20 are etched in step S7, there will either be an up to 1400 Å thick residue of the intermediate dielectric layer 50 or a portion of the gate dielectric layer 30 that is over-etched by 1400 Å. In the embodiment shown in FIG. 5, in order to totally remove the target portions of the intermediate dielectric layer 50 and the hard mask layer 20 located in the window for forming holes and contacts, the over-etching scheme is selected, i.e., the etching time is extended. As a result, portions of the gate dielectric layer 30 covering the sidewalls of the trenches 11 is over-etched, as indicated by the dashed oblong in FIG. 5.

When the over-etched thickness of the portions of the gate dielectric layer 30 is larger than 1200 Å, the yield of the TMBS device being fabricated will decrease. On the other hand, the yield of the TMBS device will also be adversely affected when the etched amount is reduced to an insufficient extent which leads to a residue of the dielectric layer.

SUMMARY OF THE INVENTION

It is therefore an objective of the present invention to provide a method for yield improvement of TMBS devices which can address the above-described over-etching and residue problems and hence improve the yield of TMBS devices.

In accordance with this objective, the method of the present invention includes the following steps in the sequence set forth: providing a substrate with a plurality of trenches formed therein; forming a gate dielectric layer over a top surface of the substrate and inner surfaces of the plurality of trenches; forming a plurality of gates in the plurality of trenches, the plurality of gates having top surfaces substantially level with the top surface of the substrate; forming a first barrier dielectric layer over the top surfaces of the plurality of gates; sequentially forming a second barrier dielectric layer and an intermediate dielectric layer over the substrate; etching the intermediate dielectric layer with the second barrier dielectric layer serving as an etch stop layer to form a window for subsequent formation of contact holes; etching the second barrier dielectric layer within the window using the first barrier dielectric layer as an etch stop layer; and etching in the window to remove a portion of the first barrier dielectric layer overlying the top surfaces of the plurality of gates and a portion of the gate dielectric layer overlying the top surface of the substrate.

Further, the formation of the plurality of trenches may include: forming a hard mask layer over the substrate; forming a patterned photoresist layer over the hard mask layer; and etching the substrate to form the plurality of trenches with the patterned photoresist layer and the hard mask layer serving as an etching mask.

Further, the method may further include removing the hard mask layer after forming the plurality of trenches.

Further, forming the gate dielectric layer over the top surface of the substrate and the inner surfaces of the plurality of trenches may include: forming a sacrificial oxide layer over the top surface of the substrate and the inner surfaces of the plurality of trenches; removing the sacrificial oxide layer by using an acid solution; and forming the gate dielectric layer over the top surface of the substrate and the inner surfaces of the plurality of trenches.

Further, the sacrificial oxide layer may be a silicon oxide layer and the acid solution may be hydrofluoric acid.

Further, the gate dielectric layer may be a silicon oxide layer formed by thermal oxidation.

Further, forming the plurality of gates in the plurality of trenches may include: forming a gate layer over the gate dielectric layer; and etching the gate layer until a top surface of the etched gate layer is level with the top surface of the substrate.

Further, the first barrier dielectric layer may be a silicon oxide layer formed on the plurality of gates by thermal oxidation.

Further, the first barrier dielectric layer may have a thickness of 500 Å to 1000 Å.

Further, the first barrier dielectric layer may be etched by dry etching.

Further, the second barrier dielectric layer may be a silicon oxide layer formed by chemical vapor deposition.

Further, the second barrier dielectric layer may have a thickness of 500 Å to 700 Å.

Further, the second barrier dielectric layer may be etched by dry etching.

Further, the intermediate dielectric layer may be a silicon oxide layer formed by chemical vapor deposition.

Further, the intermediate dielectric layer may have a thickness of 3000 Å to 5000 Å.

Further, the intermediate dielectric layer may be etched by wet etching.

Compared with the conventional methods, the method of the present invention is mainly advantageous in that successively forming a first barrier dielectric layer, a second barrier dielectric layer and the intermediate dielectric layer over the formed gates allows the underlying gate dielectric layer to be protected by the first and second barrier dielectric layers from being damaged during the process for etching away the relatively thick intermediate dielectric layer, and in that as the first barrier dielectric layer is relatively thin, its formation is associated with a small thickness non-uniformity and it can greatly reduce the total etching time of the first and the second barrier dielectric layers, thus circumventing the problem of over-etching of the gate dielectric layer portions covering the trench sidewalls as well as the problem of the dielectric layer residue. Therefore, forming a relatively thin first barrier dielectric layer can mitigate the requirements on equipment performance, reduce damage to the gate dielectric layer portions covering the trench sidewalls, expand process window and result in yield improvement of TMBS devices.

DETAILED DESCRIPTION

The method of the present invention will be described in greater detail in the following description which demonstrates preferred embodiments of the invention, in conjunction with the accompanying drawings. Those of skill in the art should, in light of the present disclosure, appreciate that many changes can be made in the specific embodiments disclosed herein and still obtain the same beneficial results. Therefore, the following description should be construed as illustrative of the principles of the present invention, and not providing limitations thereto.

For simplicity and clarity of illustration, not all features of the specific embodiments are described. Additionally, descriptions and details of well-known functions and structures are omitted to avoid unnecessarily obscuring the invention. The development of any specific embodiment of the present invention includes specific decisions made to achieve the developer's specific goals, such as compliance with system related and business related constraints, which will vary from one implementation to another. Moreover, such a development effort might be complex and time consuming but would nevertheless be a routine undertaking for those of ordinary skill in the art.

The present invention will be further described in the following paragraphs by way of example with reference to the accompanying drawings. Features and advantages of the invention will be apparent from the following detailed description, and from the appended claims. Note that the accompanying drawings are provided in a very simplified form not necessarily presented to scale, with the only intention of facilitating convenience and clarity in explaining a few exemplary embodiments of the invention.

Figure 1:
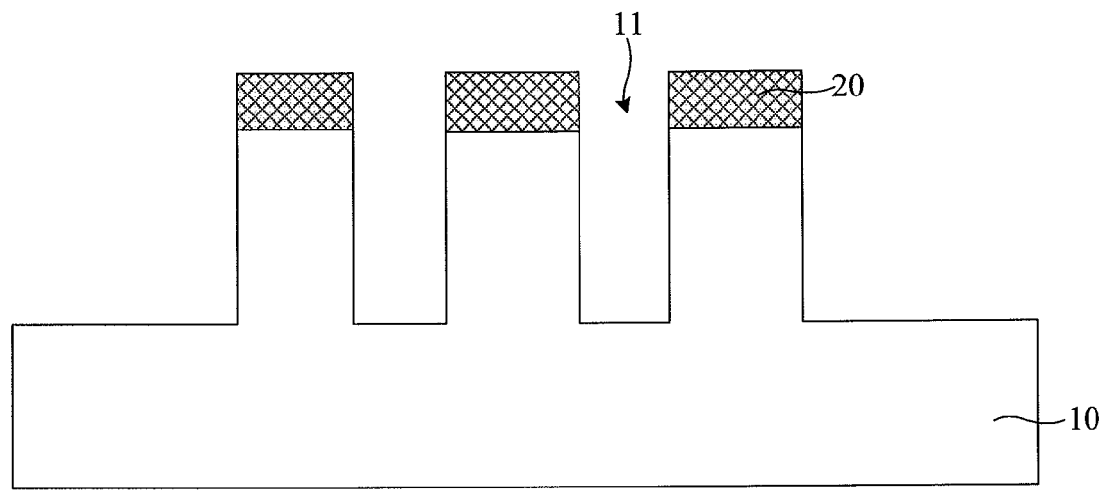
FIGS. 1 to 5 are cross-sectional views schematically illustrating steps in a conventional process for fabricating a TMBS device.
Figure 2:
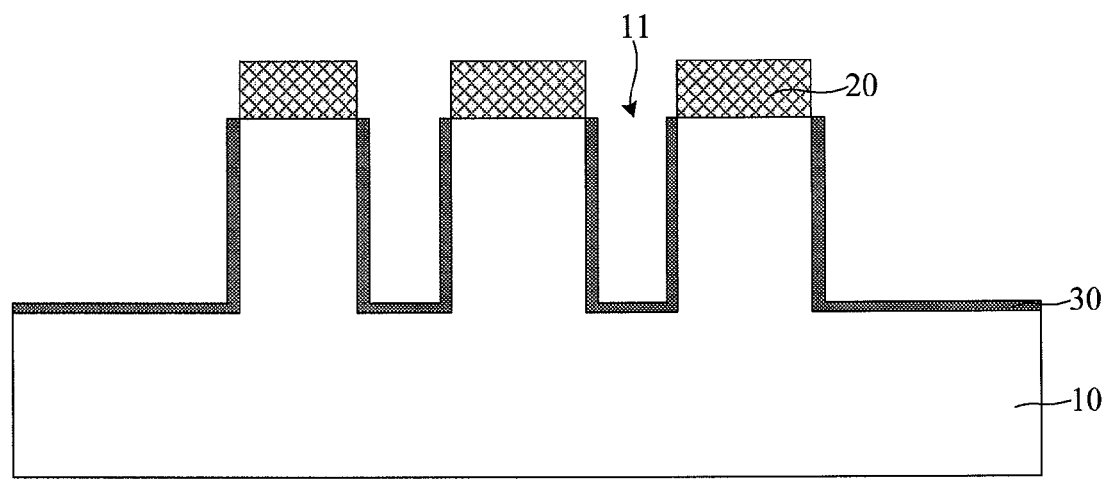
Figure 3:
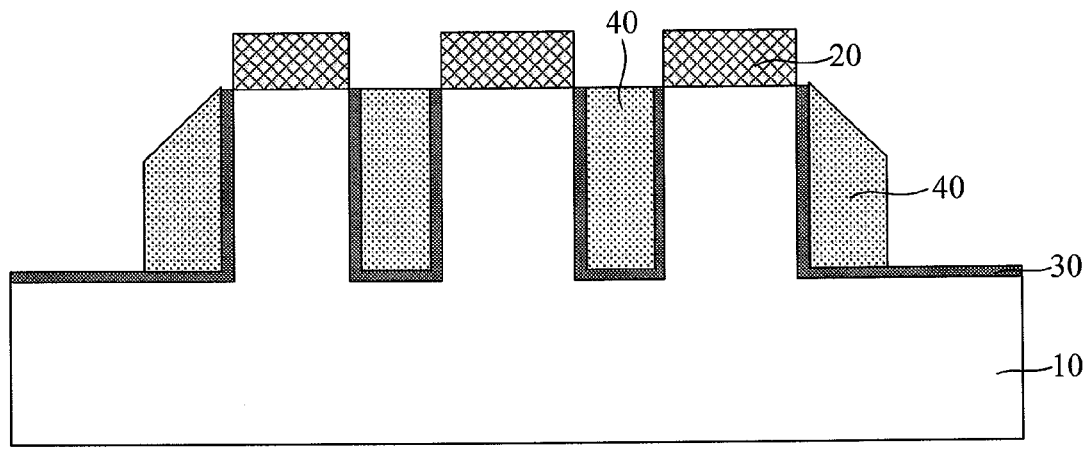
Figure 4:
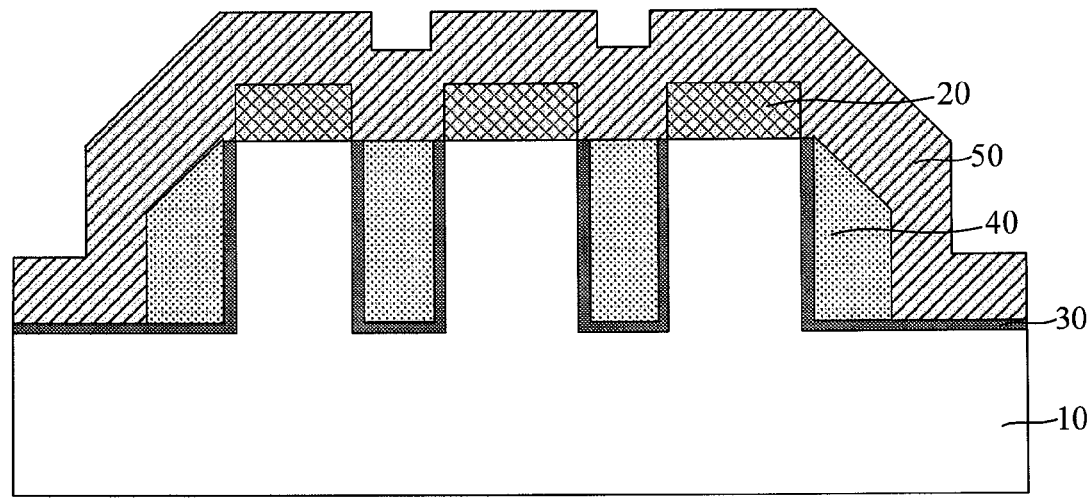
Figure 5:
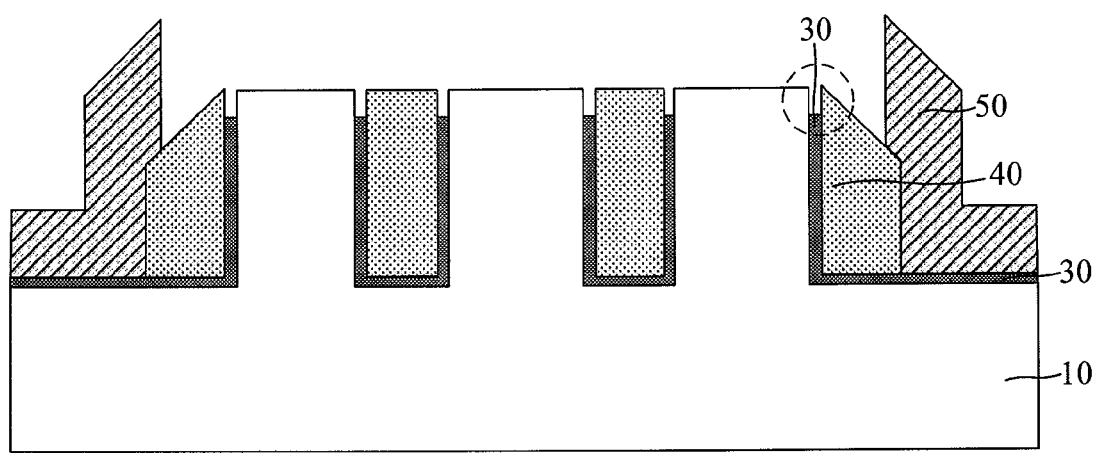
Figure 6:
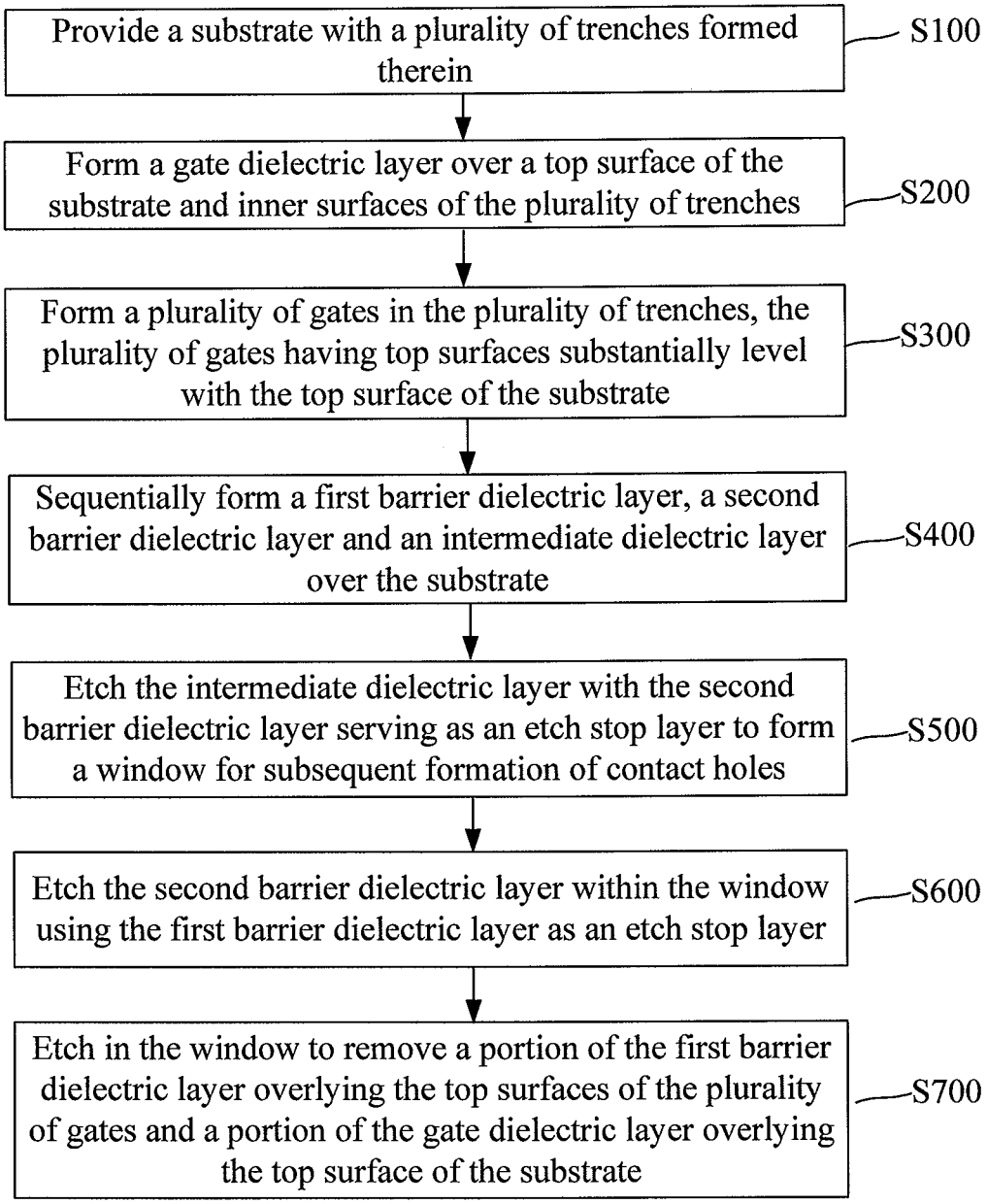
FIG. 6 depicts a flowchart graphically illustrating a method for yield improvement of TMBS devices in accordance with an embodiment of the present invention.

FIG. 6 is a flowchart graphically illustrating a method for yield improvement of TMBS devices in accordance with an embodiment of the present invention. As illustrated, the method includes the following steps:

S100) providing a semiconductor substrate 100 with a plurality of trenches 110 formed therein;

S200) forming a gate dielectric layer 300 over a top surface of the semiconductor substrate 100 and inner surfaces of the plurality of trenches 110;

S300) forming a plurality of gates 400 in the plurality of trenches 110, wherein the plurality of gates 400 have top surfaces substantially level with the top surface of the substrate 100;

S400) sequentially forming a first barrier dielectric layer 510, a second barrier dielectric layer 520 and an intermediate dielectric layer 600 over the substrate 100;

S500) etching the intermediate dielectric layer 600 with the second barrier dielectric layer 520 serving as an etch stop layer to form a window 700 for subsequent formation of contact holes;

S600) etching a portion of the second barrier dielectric layer 520 within the window 700 using the first barrier dielectric layer 510 as an etch stop layer; and S700) etching in the window 700 to remove a portion of the first barrier dielectric layer 510 overlying the top surfaces of the plurality of gates 400 and a portion of the gate dielectric layer 300 overlying the top surfaces of the substrate 100.

Figure 7:
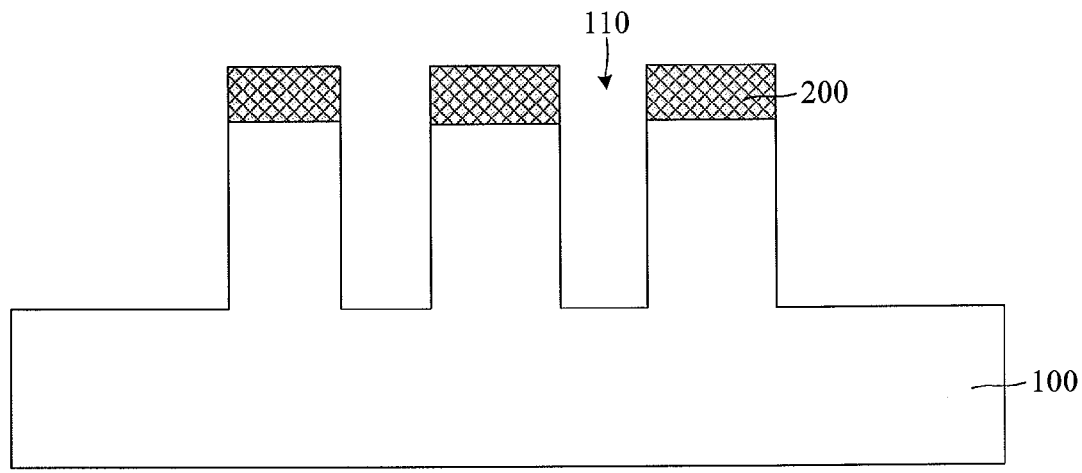
FIGS. 7 to 13 are cross-sectional views schematically illustrating steps in a method for yield improvement of TMBS devices in accordance with an embodiment of the present invention.

In step S100, the semiconductor substrate 100 may be implemented as a monocrystalline silicon substrate, a polycrystalline silicon substrate or a silicon on insulator (SOI) substrate and the formation of the trenches 110 may include:

forming a hard mask layer 200 over the semiconductor substrate 100, as shown in FIG. 7, wherein the hard mask layer 200 may be a composite layer of a first silicon oxide layer formed by thermal oxidation and a second silicon oxide layer formed from tetraethyl orthosilicate (TEOS);

forming a patterned photoresist layer (not shown) over the hard mask layer 200; and etching the semiconductor substrate 100 to form the trenches 400 with the patterned photoresist layer and the hard mask layer 200 serving as an etching mask.

In this embodiment, after the trenches 110 have been formed, the hard mask layer 200 may be removed to expose tops of the trenches 110. The removal of the hard mask layer 200 can avoid the stacking of the subsequently formed intermediate dielectric layer 600 thereon. Such stacking will lead to a larger thickness and hence a greater thickness non-uniformity. Therefore, removing the hard mask layer 200 can contribute to the thickness uniformity of the subsequently formed intermediate dielectric layer 600.

Figure 8:
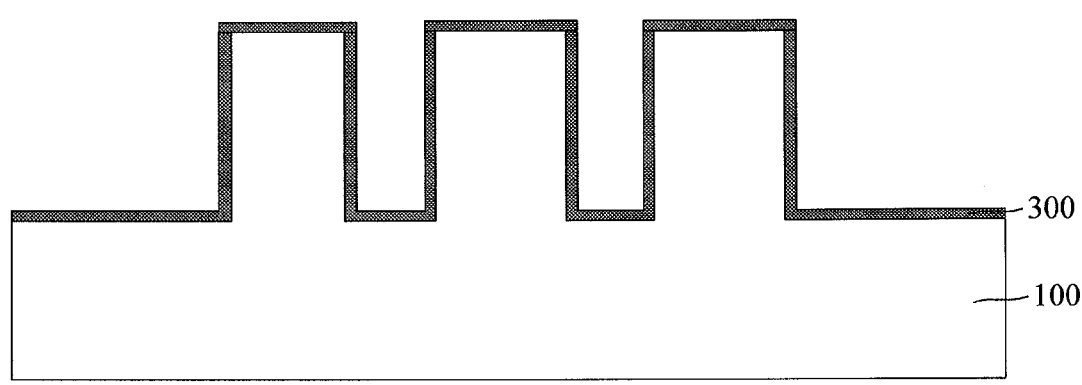

In step S200, forming the gate dielectric layer 300 over the top surface of the semiconductor substrate 100 and the inner surfaces of the trenches 110 may include:

forming a sacrificial oxide layer (not shown) over the top surface of the semiconductor substrate 100 and the inner surfaces (including sidewalls and bottoms) of the trenches 110, wherein the sacrificial oxide layer may be a silicon oxide layer formed by thermal oxidation;

removing the sacrificial oxide layer by using an acid solution, wherein the acid solution is hydrofluoric acid in this embodiment; and forming the gate dielectric layer 300 over the top surface of the semiconductor substrate 100 and the inner surfaces of the trenches 110, as shown in FIG. 8, wherein the gate dielectric layer 300 may be a silicon oxide layer formed by thermal oxidation.

Forming and removing the sacrificial oxide layer prior to the formation of the gate dielectric layer 300 can repair defects in sidewalls and bottoms of the trenches 110 and facilitate the formation of a high-quality gate dielectric layer 300.

Figure 9:
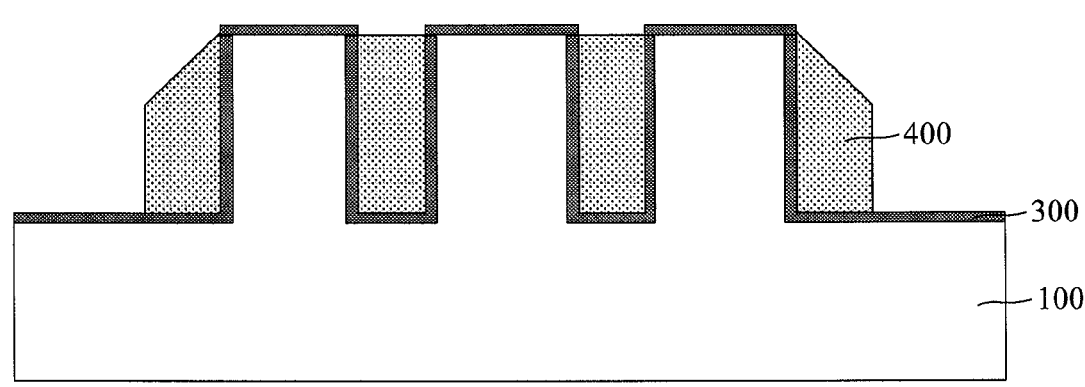

In step S300, forming the gates 400 in the trenches 110 may include:

forming a gate layer (not shown) over the gate dielectric layer 300; and etching the gate layer until the tops of the trenches 110 are exposed, namely until a top surface of the etched gate layer is level with the top surface of the substrate 100, thereby ensuring the gates 400 are located within the trenches 110 and flush with the trenches 110 at the top, as shown in FIG. 9.

Figure 10:
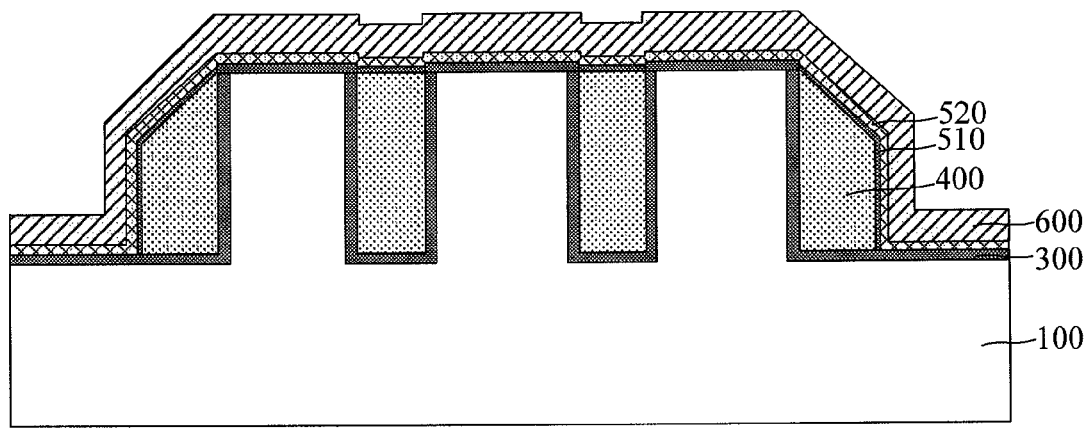

Referring to FIG. 10, in step S400, the first barrier dielectric layer 510 is selectively formed over the gates 400 by thermal oxidation. The first barrier dielectric layer 510 may be a silicon oxide layer having a thickness of 500 Å-1000 Å, for example, 800 Å. The second barrier dielectric layer 520 is then formed over the substrate, namely over the first barrier dielectric layer 510 as well as the portion of the gate dielectric layer 300 overlying the top surface of the substrate by CVD. The second barrier dielectric layer 520 may be a silicon oxide layer with a thickness of 500 Å-700 Å, for example, 600 Å. Afterward, the intermediate dielectric layer 600 is further formed over the second barrier dielectric layer 520 also by CVD. The intermediate dielectric layer 600 may be a silicon oxide layer with a thickness of 3000 Å-5000 Å, for example, 4000 Å. After the intermediate dielectric layer 600 has been formed, it may be further subjected to a densification treatment.

Figure 11:
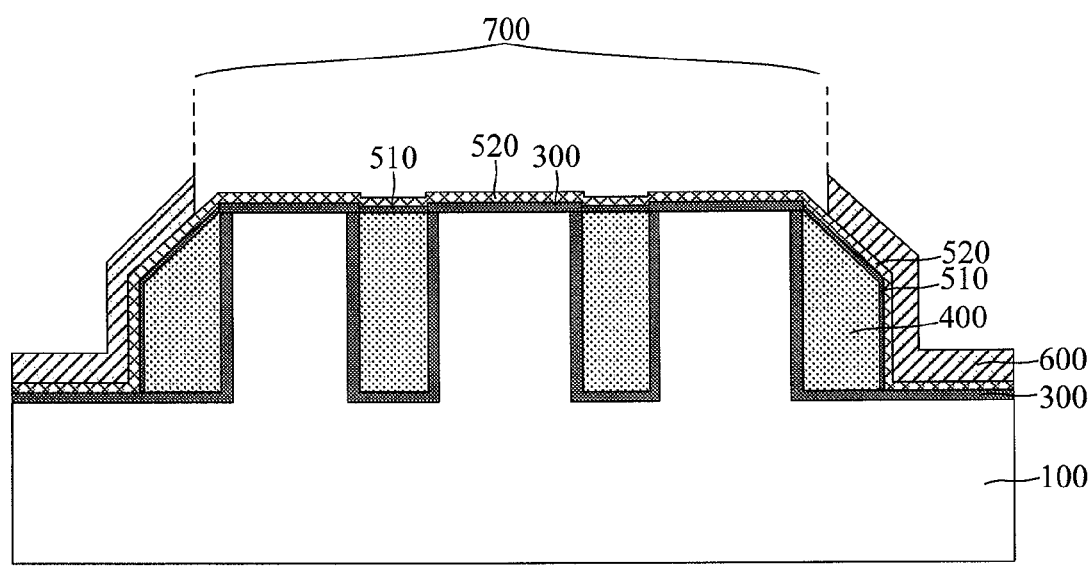

Referring to FIG. 11, with the first and second barrier dielectric layers 510 and 520 protecting the gates 400, the intermediate dielectric layer 600 does not need to be formed into a too large thickness and hence has an improved thickness uniformity. In step S500, a patterned photoresist layer (not shown) may be formed on the intermediate dielectric layer 600 and then a wet etching process is performed on the intermediate dielectric layer 600 using the patterned photoresist layer as an etching mask to form the window 700. Likewise, the second barrier dielectric layer 520 can serve as an etch stop layer for the wet etching of the intermediate dielectric layer 600.

Figure 12:
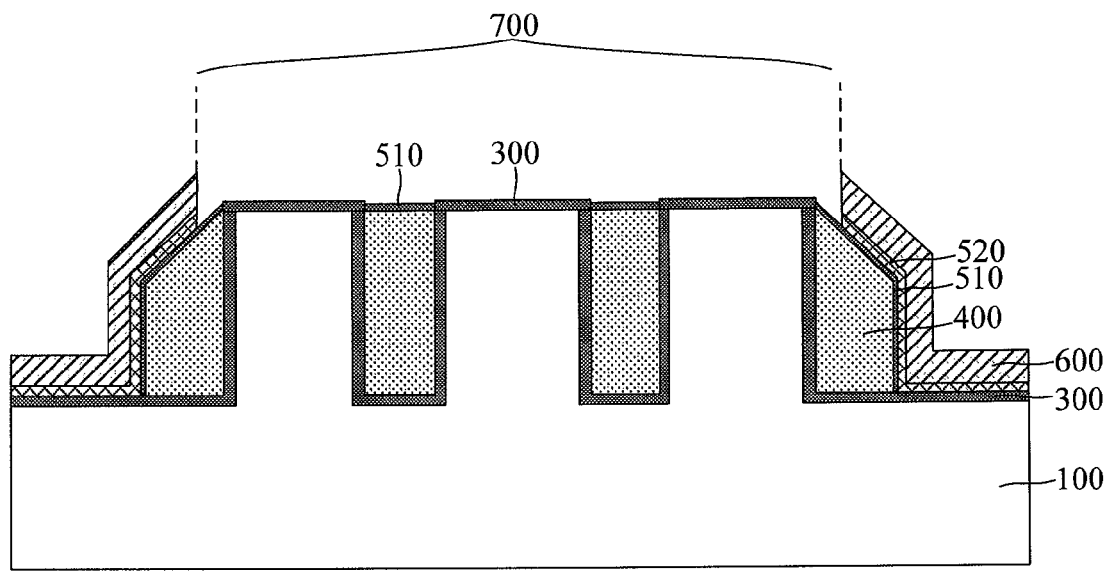

Referring to FIG. 12, in step S600, after the window 700 has been formed in the intermediate dielectric layer 600, a portion of the second barrier dielectric layer 520 within the window 700 is removed by dry etching. Similarly, the first barrier dielectric layer 510 may serve as an etch stop layer for this process.

Figure 13:
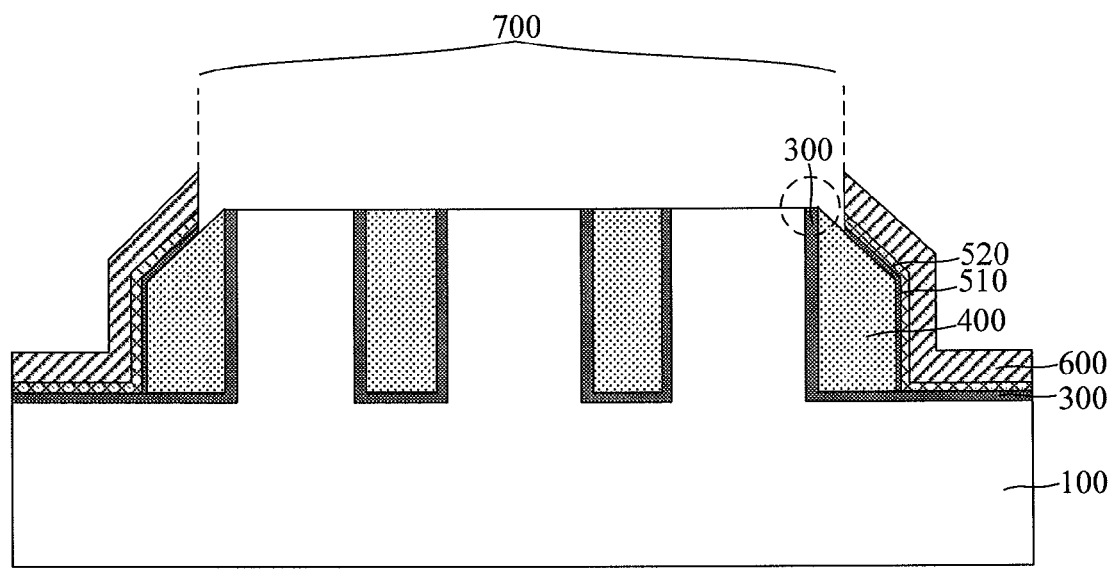

Referring to FIG. 13, in step S700, after the removal of the portion of the second barrier dielectric layer 520 within the window 700, a corresponding portion of the first barrier dielectric layer 510 overlying the gates 400 and within the window 700 and a corresponding portion of the gate dielectric layer 300 overlying the semiconductor substrate 100 and within the window 700 are removed also by dry etching. As the first barrier dielectric layer 510 and the gate dielectric layer 300 are both silicon oxide layers, their above said portions can be removed simultaneously. Further, in this process, as the thickness of the first barrier dielectric layer 510 is smaller than 1000 Å, its thickness non-uniformity is relatively small and its etching time is greatly reduced, thus enabling the etching process to proceed at a relatively uniform speed across the whole area being processed. This can reduce damage to portions of the gate dielectric layer 300 covering the sidewalls of the trenches 110 (one of the portions is indicated by a dashed oblong in FIG. 13) while preventing an insufficient etching which will lead to a dielectric material residue on the top surface of the semiconductor substrate 100, thereby resulting in an improvement in the yield of the TMBS device being fabricated.

As described above, in the method of the present invention, by forming a first barrier dielectric layer, a second barrier dielectric layer and the intermediate dielectric layer over the formed gates, the underlying gate dielectric layer can be protected by the first and second barrier dielectric layers from being damaged during the process for etching away the relatively thick intermediate dielectric layer. In addition, as the first barrier dielectric layer is relatively thin, its formation is associated with a small thickness non-uniformity and it can greatly reduce the totally processing time for removing the two barrier dielectric layers by etching. This circumvents the problem of over-etching of the gate dielectric layer portions covering the trench sidewalls as well as the problem of the dielectric layer residue. Therefore, forming a relatively thin first barrier dielectric layer can mitigate the requirements on equipment performance, reduce damage to the gate dielectric layer portions covering the trench sidewalls, expand process window and result in yield improvement of TMBS devices.

While certain preferred embodiments of the present invention are described in detail above, the scope of the invention is not to be considered limited by such disclosure. Those skilled in the art can make various modifications, substitutions and the like without departing from the scope of the invention and these are therefore considered to be within the scope of the invention.

What is claimed is:

1. A method for yield improvement of trench MOS barrier Schottky (TMBS) devices, comprising the following steps in the sequence set forth:
   providing a substrate with a plurality of trenches formed therein;
   forming a gate dielectric layer over a top surface of the substrate and inner surfaces of the plurality of trenches;
   forming a plurality of gates in the plurality of trenches, the plurality of gates having top surfaces substantially level with the top surface of the substrate;
   forming a first barrier dielectric layer over the top surfaces of the plurality of gates;
   sequentially forming a second barrier dielectric layer and an intermediate dielectric layer over the substrate;
   etching the intermediate dielectric layer with the second barrier dielectric layer serving as an etch stop layer to form a window for subsequent formation of contact holes;
   etching the second barrier dielectric layer within the window using the first barrier dielectric layer as an etch stop layer; and
   etching in the window to remove a portion of the first barrier dielectric layer overlying the top surfaces of the plurality of gates and a portion of the gate dielectric layer overlying the top surface of the substrate.

2. The method of claim 1, wherein the formation of the plurality of trenches comprises the steps of:
   forming a hard mask layer over the substrate;
   forming a patterned photoresist layer over the hard mask layer; and
   etching the substrate to form the plurality of trenches with the patterned photoresist layer and the hard mask layer serving as an etching mask.

3. The method of claim 2, further comprising removing the hard mask layer after forming the plurality of trenches.

4. The method of claim 1, wherein forming the gate dielectric layer over the top surface of the substrate and the inner surfaces of the plurality of trenches comprises:
   forming a sacrificial oxide layer over the top surface of the substrate and the inner surfaces of the plurality of trenches;
   removing the sacrificial oxide layer by using an acid solution; and
   forming the gate dielectric layer over the top surface of the substrate and the inner surfaces of the plurality of trenches.

5. The method of claim 4, wherein the sacrificial oxide layer is a silicon oxide layer and the acid solution is hydrofluoric acid.

6. The method of claim 4, wherein the gate dielectric layer is a silicon oxide layer formed by thermal oxidation.

7. The method of claim 1, wherein forming the plurality of gates in the plurality of trenches comprises the steps of:
   forming a gate layer over the gate dielectric layer; and
   etching the gate layer until a top surface of the etched gate layer is level with the top surface of the substrate.

8. The method of claim 1, wherein the first barrier dielectric layer is a silicon oxide layer formed on the plurality of gates by thermal oxidation.

9. The method of claim 8, wherein the first barrier dielectric layer has a thickness of 500 Å to 1000 Å.

10. The method of claim 9, wherein the first barrier dielectric layer is etched by dry etching.

11. The method of claim 1, wherein the second barrier dielectric layer is a silicon oxide layer formed by chemical vapor deposition.

12. The method of claim 11, wherein the second barrier dielectric layer has a thickness of 500 Å to 700 Å.

13. The method of claim 12, wherein the second barrier dielectric layer is etched by dry etching.

14. The method of claim 1, wherein the intermediate dielectric layer is a silicon oxide layer formed by chemical vapor deposition.

15. The method of claim 14, wherein the intermediate dielectric layer has a thickness of 3000 Å to 5000 Å.

16. The method of claim 15, wherein the intermediate dielectric layer is etched by wet etching.

* * * * *